United States Patent
Suzuki et al.

(10) Patent No.: US 6,841,415 B2
(45) Date of Patent: Jan. 11, 2005

(54) FLIP CHIP MOUNTING METHOD WHICH AVOIDS VOID FORMATION BETWEEN A SEMICONDUCTOR CHIP AND A SUBSTRATE

(75) Inventors: Osamu Suzuki, Niigata (JP); Haruyuki Yoshii, Niigata (JP); Kenichi Suzuki, Niigata (JP)

(73) Assignee: Namics Corporation, Niigata (JP)

( * ) Notice: Subject to any disclaimer, the term of this patent is extended or adjusted under 35 U.S.C. 154(b) by 0 days.

(21) Appl. No.: 10/240,806

(22) PCT Filed: Apr. 13, 2001

(86) PCT No.: PCT/JP01/03183

§ 371 (c)(1), (2), (4) Date: Oct. 4, 2002

(87) PCT Pub. No.: WO01/80302

PCT Pub. Date: Oct. 25, 2001

(65) Prior Publication Data

US 2003/0059978 A1 Mar. 27, 2003

(30) Foreign Application Priority Data

Apr. 14, 2000 (JP) .................................... 2000-113081

(51) Int. Cl.[7] .............................................. H01L 21/44
(52) U.S. Cl. ...................... 438/106; 438/108; 438/127; 438/612; 438/613
(58) Field of Search ..................... 438/127, 106–108, 438/612–614

(56) References Cited

U.S. PATENT DOCUMENTS 5,994,165 A    11/1999    Yoshino et al.
6,069,024 A  *  5/2000   Murakami ................... 438/108
6,410,415 B1 *  6/2002   Estes et al. .................. 438/612
6,420,213 B1 *  7/2002   Nakajyo et al. ............. 438/118

FOREIGN PATENT DOCUMENTS

| JP | 7-312377 A  | 11/1995 |
| JP | 8-337635 A  | 12/1996 |
| JP | 10-223686 A | 8/1998  |
| JP | 2000-156560 A | 6/2000 |

OTHER PUBLICATIONS

English language International Preliminary Examination Report issued in International Application No. PCT/JP01/03183 filed Apr. 13, 2001 (the International application corresponds to the present application).

* cited by examiner

*Primary Examiner*—Thanh Nguyen
(74) *Attorney, Agent, or Firm*—Frishauf, Holtz, Goodman & Chick, P.C.

(57) ABSTRACT

The present invention is to provide a flip chip mounting method which does not cause void formation between a semiconductor chip and a substrate, and in the flip chip mounting method, the method comprising the steps of: (A) drying the substrate; and (B) at least one step of: (1) dispensing uncured sealant at least at a bump pressing portion on the surface of the substrate and/or the entire portion of the substrate where minute irregularities are present; and (2) performing a pressing and the curing of the underfill while maintaining the temperature conditions so that a temperature difference between the semiconductor chip and the substrate does not cause convection substantially in the uncured or curing underfill.

5 Claims, 1 Drawing Sheet a b c a b c

FLIP CHIP MOUNTING METHOD WHICH AVOIDS VOID FORMATION BETWEEN A SEMICONDUCTOR CHIP AND A SUBSTRATE

This application is a U.S. National Phase Application under 35 USC 371 of International Application PCT/JP01/3183 filed Apr. 13, 2001.

FIELD OF THE INVENTION

The present invention relates to a flip chip mounting method, and more particularly to a flip chip mounting method in which the gap between a semiconductor chip and a substrate is filled up using an underfill so as not to cause void formation.

BACKGROUND ART

In the mounting of a semiconductor chip such as an integrated circuit (IC), to a substrate by wire bonding, as the number of electrodes increases, the operating efficiency and reliability are lowered. As a substitute for the wire bonding, a flip chip method has widely been employed because the method requires only a small mounting area, and can render the resultant height smaller and can achieve downsizing of semiconductor packages and improvement of the mounting efficiency as well as speeding up of the operation of electronic apparatus.

As one of bonding techniques by the flip chip method, there is a method in which a semiconductor chip is bonded to a substrate, and then, an insulating resin or a paste containing such a resin (hereinafter, these are collectively referred to as "sealant") in an uncured state is injected into the gap between the semiconductor chip and the substrate, followed by curing. However, by this method, a period of time for flow the underfill into the void in a length of, for example, 2 cm, requires 6 to 10 minutes. Also, in a large-size chip such that the flow length is more than 2 cm, flow of an underfill is difficult. And yet, the underfill cannot be uniformly flowed, whereby occurrence of voids is remarkable.

Therefore, as an improvement of the above flip chip method, the method shown in FIGS. 2a to 2c is used in which an underfill 2 is dispensed in an uncured state onto the upper surface of a substrate 1 having conductive portions on the upper surface, and a semiconductor chip 3 having bumps (protruding electrodes) 4 on the back surface is mounted on the substrate so that the underfill is spread over the upper surface of the substrate, and then, the underfill 2 is cured by heating from the upper surface of the substrate by means of heating press 5 while pressing the bumps against the conductive portions on the upper surface of the substrate to seal up the gap between the semiconductor chip 3 and the substrate 1. FIG. 2a shows a step of dispensing an uncured sealant, FIG. 2b shows a step of mounting a semiconductor chip, and FIG. 2c shows a step of curing the underfill while pressing the bumps against the substrate, and the method is carried out in this order. For easy understanding of the method, a semiconductor chip having only two bumps is shown in FIG. 2, but, as described below, a number of bumps are generally present per semiconductor chip. Further, there is employed a method in which a substrate having thereon a bump is used, irrespective of whether or not the semiconductor chip has a bump, and the bump is provided at the substrate side and pressed against the bump or electrode on the semiconductor chip side.

The mounting of semiconductor chips by a flip chip method is disclosed in, for example, Japanese Provisional Patent Publications No. 25143/1992, No. 254345/1992 and No. 280443/1992. As materials for the bump, Japanese Provisional Patent Publication No. 25143/1992 describes metals formed by electroplating, Japanese Provisional Patent Publication No. 254345/1992 describes Au, and Japanese Provisional Patent Publication No. 280443/1992 describes various solder alloys, for example, Sn/Pb solder and Pb/In solder.

When mounting is conducted by a flip chip method, even by the above-mentioned improvement method, the gap between the semiconductor chip and the substrate cannot be fully filled with the sealant, and sometimes causing a void. When such a void is present, moisture is condensed in the void in a heat cycle during the use of the resultant package to lower the withstand voltage, causing leakage current. Therefore, establishment of a flip chip mounting method which does not cause void formation is desired.

On the other hand, when wiring is formed on the surface layer of the substrate and/or in the substrate, the upper surface of the resultant substrate has fine unevenness to prevent flowing of the uncured sealant or the sealant, which becomes a cause of forming a void. Thus, with respect to the mounting by pressing when a semiconductor chip is mounted by pressing against the substrate having a fine unevenness, a flip chip mounting method which does not cause void formation is desired like in the mounting by pressing a semiconductor chip having a bump against the substrate.

Accordingly, a task of the present invention is to provide a flip chip mounting method which does not cause void formation between a semiconductor chip and a substrate.

The present inventors have made extensive and intensive studies with a view toward solving the above-mentioned problems. As a result, they have found that the cause of the void formation resides in the presence of moisture in the substrate, the way of feeding a sealant, and the convection in the underfill caused by the difference in temperature between the semiconductor chip and the substrate, and the task can be achieved by removing the cause, and thus the present invention has been completed.

SUMMARY OF THE INVENTION

The mounting method of the present invention is a flip chip mounting method in which a semiconductor chip having a bump is pressed against a substrate so that the bump of the semiconductor chip faces the substrate or a semiconductor chip having no bump is pressed against a substrate having a bump on the surface and/or having fine unevenness for circuit pattern to seal up the gap between the semiconductor chip and the substrate using an underfill, the method comprises the steps of:

(A) drying the substrate; and (B) at least one step of:

(1) dispensing uncured underfill at least at a bump pressing portion on the surface of the substrate and/or the entire portion of the substrate where minute irregularities are present; and (2) performing a pressing and the curing of the sealant while maintaining the temperature conditions so that a temperature difference between the semiconductor chip and the substrate does not cause convection substantially in the uncured or curing underfill.

BRIEF DESCRIPTION OF THE DRAWINGS

FIG. 1a shows a dispensing step of an uncured underfill, FIG. 1b shows a mounting step of a semiconductor chip, and FIG. 1c shows a pressing and curing step.

FIG. 2a shows a dispensing step of an uncured underfill, FIG. 2b shows a mounting step of a semiconductor chip, and FIG. 2c shows a pressing and curing step.

BEST MODE FOR CARRYING OUT THE INVENTION

Figure 1A:
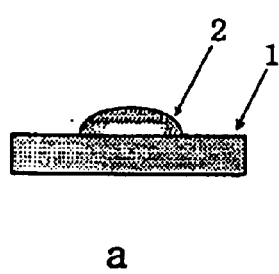
FIGS. 1a to 1c are diagrammatic cross-sectional views showing a representative example of a flip chip mounting method of the present invention (provided that drying step (A) is omitted)

The semiconductor chip used in the present invention may be any of a discrete semiconductor device such as a transistor or a diode; and a chip such as IC or LSI, formed by integrating microdevices, together with their circuits. For preventing the semiconductor chip from being adversely affected by impurity ions in moisture and in the atmosphere, a protecting film comprised of $SiO_2$, $Si_3N_4$, $Al_2O_3$, or glass may be formed on the surface of the semiconductor chip, exclusive of the electrode portions.

On the semiconductor chip used in the flip chip method, representatively, a bump is provided so that the electrode of the semiconductor chip is connected to the conductive portion of a substrate through the bump after mounting. For example, the semiconductor chip generally has an area of 1 $mm^2$ to 900 $cm^2$, and has, for example, 10 to 3,000 bumps or more per semiconductor chip. As the bump, a metal such as Au, Ag, Cu, Al, or an alloy comprised mainly of these; a metal complex such as Au-plated Cu; or solder such as Sn, Sn/Pb, Pb/In, Sn/Bi, or Sn/Ag, is used. When solder is used as a bump, a fatty acid such as oleic acid or malic acid, may be added as a flux to the solder or an underfill, and, when a phenolic resin is used as a curing agent for the underfill, the phenolic resin moves to the bump to serves as a flux. The load of pressing may be in a wide range of from several grams per semiconductor chip to 50 g per bump. Specifically, when the bump is comprised of solder, the load is in the range of from several grams to several tens grams per semiconductor chip, and, when the bump is comprised of a metal such as gold, a load of 20 to 50 g is needed per bump. It is preferred to use solder as a bump since solder can be melted by heating to 185 to 250° C. and thus excellent adhesion between the solder and the conductive portion of a substrate can be easily obtained, and only a small load is needed in the pressing, so that the semiconductor chip suffers no damage.

The bump can be shaped into various forms such as a hemisphere form, a mushroom-like form, a cylinder form, a plate form, and a protrusion form. When the bump is in a protrusion form, the bump may be either vertical on the semiconductor chip surface or at an arbitrary angle. The height of the bump is generally 150 $\mu$m or less, preferably to 100 $\mu$m, in the direction perpendicular to the semiconductor chip surface.

As an insulating portion of the substrate, a resin such as an epoxy resin, polyimide, a maleimide resin, polyethylene terephthalate, polyphenylene oxide, or a liquid crystalline polymer; a laminated product obtained by combining, for example, an epoxy resin with glass fiber; or an inorganic material such as glass or ceramic, is used, and these may be either hard or flexible.

The substrate has a conductive portion such as a conductive layer or wiring, and the conductive portion is provided at a position corresponding to at least the bump or electrode on the surface of the substrate onto which a semiconductor chip is mounted. As the conductive portion, Cu, Ni-plated Cu, Au-plated Cu, solder-plated Cu, Al, or Ag/Pd is used.

Wiring is formed on the surface layer and/or in the inner layer of the substrate, and hence the surface of the substrate has fine unevenness, and the uneven surface may prevent the underfill from flowing smoothly to cause void formation. The height of the unevenness is generally 5 to 15 $\mu$m. A bump may be provided on the substrate so that the bump is connected to the conductive portion of the substrate. The number, material, and form of the bump provided on the substrate are similar to those of the bump formed on the semiconductor chip.

A bump is formed on the semiconductor chip and/or the substrate, and therefore, the combinations of the bonding portions by pressing between the semiconductor chip and the substrate are various, for example, a combination of the bump of the semiconductor chip and the conductive portion of the substrate, that of the bump of the semiconductor chip and the bump of the substrate, and that of the electrode of the semiconductor chip and the electrode of the substrate. It is preferred that the bonding is made by soldering since both the temperature for pressing and the load of pressing are low in the soldering as mentioned above.

The present invention is applied not only to the case where the above-mentioned semiconductor chip having a bump is pressed against a substrate so that the bump of the semiconductor chip faces the substrate but also to the case where a semiconductor chip having a bump or no bump is pressed-against a substrate having a bump and/or fine unevenness caused by wiring pattern so that the bump or electrode of the semiconductor chip faces the bump and/or the uneven surface of the substrate.

As the sealant, there is used a resin paste obtained by incorporating into an epoxy resin, an oxetane resin, a maleimide resin, or a resin mixture of two or more of these resins; inorganic filler such as silica, titanium oxide, aluminum oxide, magnesium oxide, zinc oxide, or calcium carbonate; and a rubber material such as butadiene rubber particles. If desired, a curing agent such as a phenolic resin, an acid anhydride, a polyamine, or an onium salt; a curing accelerator such as an imidazole or an organic peroxide; a flame retardant such as a bromine compound or a phosphorus compound; a defoaming agent such as polydimethylsiloxane or a composition containing the same; a coloring agent such as an organic pigment; and alsilane coupling agent can be incorporated into the sealant.

For imparting appropriate flowability to the uncured sealant, a reactive diluent such as a low-molecular compound having in the molecule thereof one oxirane ring or two or more oxirane rings, can be incorporated into the underfill.

The viscosity of the uncured underfill at 25° C. is generally 10 to 2,000 Pa·s, preferably 20 to 200 Pa·s.

Figure 1B:
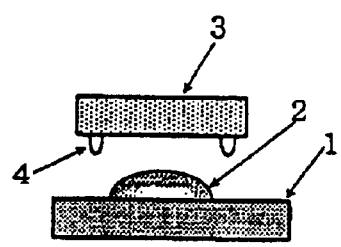
Figure 1C:
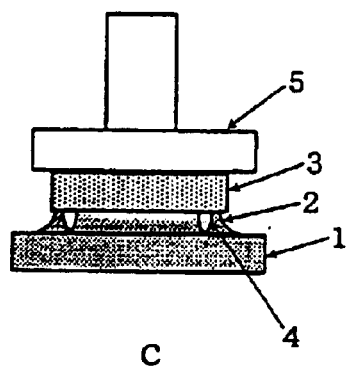
Figure 2A:
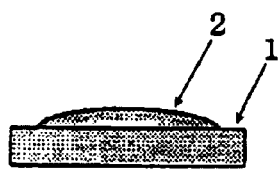
FIGS. 2a to 2c are diagrammatic cross-sectional views showing a representative example of a general flip chip mounting method.
Figure 2B:
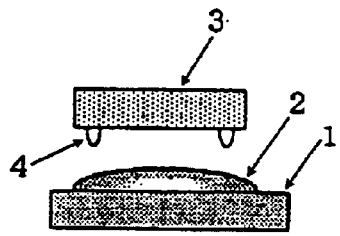
Figure 2C:
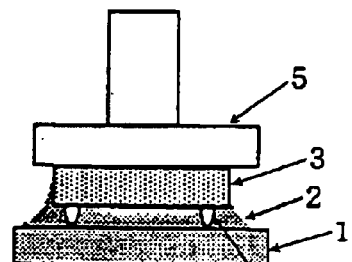

Diagrammatic views of a representative example of a mounting method of the present invention are shown in FIGS. 1a to 1c. FIG. 1 show the mounting method for a semiconductor chip having a bump wherein step (A) is combined with both steps (1) and (2) as step (B), and wherein step (A) is not shown. Characters a, b, and c seen in FIG. 1 correspond not to the numbers assigned to the steps in the present invention but to FIGS. 2a to 2c. Like in FIGS. 2, a semiconductor chip having only two bumps is shown in FIG. 1. In the respective figures, reference numeral 1 designates a substrate, reference numeral 2 designates a underfill, reference numeral 3 designates a semiconductor chip, reference numeral 4 designates a bump, and reference numeral 5 designates a heating press.

The first characteristic feature of the mounting method of the present invention resides in that a step of drying a substrate is provided as step (A) before dispensing an uncured underfill. When moisture is present on the surface of the substrate, the moisture enters the uncured underfill and volatilizes during curing of the underfill, and the resultant void cannot be underfilled up by the surrounding underfill, so that the void remains in the cured sealant. The drying is conducted by heating the substrate generally to 90° C. or higher, preferably to 100 to 150° C., for 0.5 to 2 hours. A preferred drying method is blowing against the substrate a dried nitrogen gas heated to the above temperature. The dried substrate has substantially no moisture on its surface. It is preferred that the dried substrate is used in a pressing and sealing operation immediately after drying, but the dried substrate may be allowed to stand in a clean room containing a dried atmosphere for about 1 hour and then used.

The second characteristic feature of the mounting method of the present invention resides in that step (B) to be combined with step (A) includes step (1) of dispensing an underfill or step (2) of pressing and curing the underfill, each of which is conducted under the below-described specific conditions. Further, for more surely preventing void formation, it is preferred that an underfill having a volatile component of 1.0% by weight or less is used, or, as shown in FIG. 1, after dispensing an underfill in step (1), pressing and curing are conducted in step (2).

A requirement for step (1) used in the present invention is that, in the step of dispensing an uncured underfill onto the surface of a substrate to pile up the underfill on the surface of the substrate, the underfill be dispensed onto at least all over the portion of the surface of the substrate to which the bump is pressed in the subsequent step and/or the portion of the substrate where minute irregularities are present. The uncured underfill has viscosity, and therefore, the uncured underfill may be dispensed and piled up on part of the portion of the substrate to which the bump of the semiconductor chip is pressed and/or part of the portion of the substrate where minute irregularities are present, and spread over the surface of the substrate by pressing downwardly the semiconductor chip to be mounted to achieve underfilling. However, in such a method, the uncured underfill does not satisfactorily flow to cause a portion which the underfill does not reach on the downstream side of the bump of the semiconductor chip and/or on the downstream side of the bump and/or convex portion of the substrate, so that it remains as a void after curing.

In the subsequent pressing and curing step, the temperature of the underfill is elevated to about 150° C. or higher. When the underfill contains an ingredient which volatilizes at the above temperature, volatilization of such an ingredient causes void formation. Therefore, it is preferred that the content of the ingredient which volatilizes at the temperature for pressing and curing in the uncured underfill used in the present invention is 1.0% by weight or less, and it is especially preferred that the uncured underfill contains substantially no volatile ingredient. Examples of volatile ingredients include non-reactive diluents such as organic solvents; low-molecular weight monomers and reactive diluents, each having a small reaction rate at the above temperature; and acid anhydrides.

The uncured underfill can be dispensed by a printing process such as stencil printing or screen printing, or a coating process using, for example, a dispenser.

A requirement for step (2) in the mounting method of the present invention is that, in the step of curing the underfill while pressing the bump against the substrate, the temperature difference between the semiconductor device and the substrate be adjusted so that substantially no convection occurs in the uncured underfill or the underfill being cured. Specifically, the temperature difference is maintained preferably at 200 K or lower, further preferably at 50 to 150 K, although it varies depending on the composition of the resin. When convection occurs in the underfill, the convection causes vortex especially on the downstream side of the bump of the semiconductor chip and the bump of the substrate and/or the convex portion of the substrate, resulting in a portion in which no underfill is present, i.e., void.

Generally, for applying a force for pressing the bump or electrode of the semiconductor chip against the substrate while heating the semiconductor chip in the pressing and curing step, a heating press for heating and pressing the semiconductor chip is provided on the upper surface of the semiconductor chip. Therefore, the temperature of the semiconductor chip varies depending on the type of the material for the bump and the curing temperature for the underfill, but, when solder is used as a bump, the temperature of the semiconductor chip is generally 200 to 280° C. On the other hand, when the substrate is allowed to stand after being dried or is cooled during feeding of the underfill, the temperature of the substrate is close to room temperature, and thus the above-mentioned temperature difference cannot be achieved, so that a void remains in the cured underfill. Therefore, the temperature difference is required to be maintained in the above range by feeding the underfill in a short time so that the substrate dried as described above is maintained at the drying temperature until it is subjected to pressing and curing step, or by separately providing a means for heating the substrate. As an example of means for heating the substrate, there can be mentioned a method in which a heater is provided on the stage-of the substrate to heat the substrate.

When a metal such as gold or copper is used as a bump or when the electrode of the semiconductor chip is directly pressed against the substrate, the semiconductor chip is needed to be heated to generally 200 to 400° C., preferably 200 to 300° C. In this case, for maintaining the temperature difference in the similar range, the heating temperature for the substrate is needed to be elevated to a higher temperature than that in the case using solder as a bump.

Under the above conditions, the underfill is cured while pressing the bump or electrode against the substrate. The time required for the pressing and curing step is generally 0.1 to 20 seconds, preferably 0.5 to 10 seconds.

With respect to the heating of the semiconductor chip by means of a heating press, void formation can be suppressed by performing the heating according to a temperature cycle in which, when the curing time is, for example, 3 to 10 seconds, the temperature of the heating press is once lowered to 100 to 150° C. and then elevated over 5 to 10 seconds and the semiconductor chip is maintained at a predetermined temperature for 3 to 10 seconds, rather than by performing the heating in a manner such that the temperature of the heating press is kept constant.

Thus, not only can large void formation be prevented, but also small void formation can be suppressed, so that the properties of the package can be stabilized to the extent that problems of practical use are removed. Especially when steps (1) and (2) are combined or the volatile component of the sealant is suppressed to 1.0% by weight or less, it is possible to completely prevent void formation.

EXAMPLES

Hereinbelow, the present invention will be described in more detail with reference to the following Examples, which should not be construed as limiting the scope of the present invention. In the following Examples and Comparative Examples, "part(s)" and "%" are given by weight.

In the following Examples and Comparative Examples, silicon IC chip mounting was conducted as follows unless otherwise specified. Specifically, a chip is squared and has a 5×5 mm planar size, and has on the back surface thereof, exclusive of the edge portion having a width of 100 $\mu$m, protruding Sn/Pb solder bumps each having a length of 100 $\mu$m at intervals of 120 $\mu$m. As an underfill, in each of Examples 1 to 8 and Comparative Examples 1 and 2, a bisphenol A/bisphenol F epoxy resin composition having the formulation shown in Table 1, having a viscosity at 25° C. of 55 Pa·s, and having a volatile component of 1.2% with respect to the ingredients which volatilize at 250° C. was used, and, in each of Examples 9 and 10, a resin composition having the same formulation and the same viscosity, and having a volatile component of 0.6% with respect to the ingredients which volatilize at 250° C. was used. The measurement of the volatile component was conducted by the following method. Specifically, 1 g of a sample was applied to an aluminum foil so that the resultant thickness became about 200 $\mu$m, and cured by heating the aluminum foil on a hot plate set at a predetermined temperature for curing for 30 seconds, and then, a weight loss was measured.

TABLE 1

| Component | Formulation amount (part) |
|---|---|
| Bisphenol A type epoxy resin | 100 |
| Bisphenol F type epoxy resin | 80 |
| Resol type phenol resin | 16 |
| Silica fine powder | 11 |
| 2-Ethyl-4-methylimidazole | 12 |
| Isophthalic hydrazide | 30 |
| Defoaming agent | 0.1 |

With respect to the portion between the semiconductor chip and the substrate which were bonded together, a specific area containing 5×8 bumps was selected at the right-hand lower portion of the semiconductor chip, and a picture of this area as viewed from the polyimide substrate side was taken through an optical microscope, so that the number of void(s) was observed.

Examples 1 to 3

Polyimide substrate 1 having on the upper surface thereof solder-plated Cu conductive portions at positions corresponding to the respective positions of the bumps of a silicon IC chip was dried by heating at 150° C. for 30 minutes. Uncured underfill 2 was dispensed by means of a dispenser onto the upper surface of the substrate 1 in a 5×5 mm area corresponding to the size of the IC chip to be mounted. While heating the substrate to 100° C. (Example 1), 125C (Example 2), or 150° C. (Example 3), the IC chip was pressed downwardly and heated to 280° C. by means of a heating press, and the sealant was cured while pressing bumps 4 of the chip against the conductive portions of the polyimide substrate 1 for 5 seconds.

Observation showed no void formation in each of Examples 1 to 3.

Comparative Example 1

An underfill was cured while pressing the bumps of an IC chip against a polyimide substrate in substantially the same manner as in Example 1 except that the polyimide substrate was not dried but allowed to stand in an atmosphere at 25° C. at 60% RH for 24 hours, and then an uncured underfill was dispensed onto the upper surface of the resultant substrate. Five very large voids were found in the area observed.

Examples 4 and 5

Polyimide substrate dried under the same conditions as those in Example 1 was cooled in a dried nitrogen gas at 25° C. (Example 4) or 70° C. (Example 5), and then, mounting was conducted in the same manner as in Example 1. As a result, 12 small voids and 8 small voids were found, respectively, in Examples 4 and 5 in the respective areas observed.

Example 6

Drying and mounting were conducted in substantially the same manner as in Example 1 except that an uncured underfill was dispensed onto the substrate in a 3×3 mm area which was the center portion of the area corresponding to the size of the IC chip to be mounted, and the underfill was spread by pressing the IC chip downwardly so that the underfill covered the edge portion of the IC chip. As a result, in the area observed, one small void was individually found at the respective right-hand lower portions of 6 bumps, wherein the right-hand lower portion of the bump corresponded to the portion which was downstream of the bump, as viewed in the direction of the flow of the sealant from the left-hand upper corner to the right-hand lower corner.

Comparative Example 2

Drying and mounting were conducted in substantially the same manner as in Example 1 except that an uncured underfill was dispensed onto the substrate in a 3×3 mm area which was the center portion of the area corresponding to the size of the IC chip to be mounted, and the underfill was spread by pressing the IC chip downwardly so that the underfill covered the edge portion of the IC chip, and that the temperature of the substrate was changed to 50° C. As a result, in the area observed, 1 to 3 small voids were found individually at the respective right-hand lower portions of 21 bumps, wherein the right-hand lower portion of the bump corresponded to the portion which was downstream of the bump, as viewed in the direction of the flow of the underfill from the left-hand upper corner to the right-hand lower corner. Among the voids observed, many voids larger than those observed in Examples 4 to 6 were present in the downstream portions, as viewed in the direction of the flow of the underfill.

Examples 7 and 8

Drying and mounting were conducted in Example 7 under substantially the same conditions as those in Example 1 or conducted in Example 8 under substantially the same conditions as those in Example 6, except that a glass substrate was used as a substrate. As a result, no void formation was found in Example 7, and, in Example 8, one small void was individually found at the respective right-hand lower portions of five bumps.

Example 9

Drying and mounting were conducted under substantially the same conditions as those in Example 5 except that a resin composition having a volatile component of 0.6% was used. As a result, no void formation was found in the area observed.

Example 10

Drying and mounting were conducted under substantially the same conditions as those in Example 6 except that a resin composition having a volatile component of 0.6% was used. As a result, no void formation was found in the area observed.

Example 11

A polyimide multilayer substrate having a copper wiring pattern in the surface layer portion and having electroplated 10 $\mu$m Sn on the 25×25 $\mu$m square land portion was used. Drying was conducted under the same conditions as those in Example 1, and a silicon IC chip having no bump and having 100 connection portions was mounted on the substrate under the following conditions. Specifically, the temperature of the substrate was adjusted to be 100° C., and the same sealant as that used in Example 1 was dispensed so as to cover the land portion of the substrate. The IC chip was pressed for 3 seconds by pulse heat at a temperature of 270° C. at a load of 20 g. Observation showed no void formation.

INDUSTRIAL APPLICABILITY

With respect to the mounting of a semiconductor chip having a bump on a substrate by a flip chip method and/or the mounting of a semiconductor chip having no bump on a substrate having fine unevenness by a flip chip method, a mounting method which does not cause void formation between the semiconductor chip and the substrate can be obtained by the present invention. The semiconductor package obtained by the method of the present invention is advantageous not only in that the package does not suffer moisture condensation in a heat cycle during the use of the package and therefore it does not suffer a lowering of the withstand voltage and an occurrence of leakage current due to the moisture condensation, but also in that it stably exhibits excellent properties in long-term usage. Therefore, the mounting method of the present invention is extremely useful for mounting of wide variety of semiconductor chips including IC and LSI.

What is claimed is:

1. A flip chip mounting method in which a semiconductor chip having a bump is pressed against a substrate so that the bump of the semiconductor chip faces the substrate or a semiconductor chip having no bump is pressed against a substrate having a bump on the surface and/or having a finely uneven surface due to a wiring pattern to seal up the gap between the semiconductor chip and the substrate using an underfill, the method comprising the steps of:

(A) drying the substrate; and (B) dispensing uncured underfill at least at an entire portion of a bump pressing portion on the surface of the substrate and/or the entire portion of the substrate where minute irregularities are present; and (C) performing a pressing and the curing of the underfill while maintaining the temperature conditions so that a temperature difference between the semiconductor chip and the substrate 200°K or lower.

2. The mounting method according to claim 1, wherein the dispensed uncured underfill has a volatile component which volatiles at a pressing and curing temperature of 1.0% by weight or less.

3. The mounting method according to claim 1, wherein the pressing is made by solder bonding.

4. The mounting method according to claim 2, wherein the pressing is made by solder bonding.

5. The mounting method according to claim 1, wherein the temperature difference between the semiconductor chip and the substrate is in the range of 50°K to 150°K.

* * * * *